US007515073B2

(12) United States Patent
Tracht et al.

(10) Patent No.: US 7,515,073 B2
(45) Date of Patent: Apr. 7, 2009

(54) DIGITAL SAMPLE RATE CONVERSION

(75) Inventors: Thorsten Tracht, Munich (DE); Guenther Hackl, Altoetting (DE)

(73) Assignee: Infineon Technologies AG, Nuebiberg (DE)

( * ) Notice: Subject to any disclaimer, the term of this patent is extended or adjusted under 35 U.S.C. 154(b) by 0 days.

(21) Appl. No.: 11/840,893

(22) Filed: Aug. 17, 2007

(65) Prior Publication Data
US 2009/0045992 A1 Feb. 19, 2009

(51) Int. Cl.
*H03M 7/00* (2006.01)
(52) U.S. Cl. .................. 341/61; 375/355; 375/373; 332/103; 348/580
(58) Field of Classification Search .......... 341/50–90; 375/355, 373; 332/103; 348/580; 323/282
See application file for complete search history.

(56) References Cited
U.S. PATENT DOCUMENTS

| 4,682,227 | A | * | 7/1987 | Heerah | 348/580 |
| 4,866,647 | A | | 9/1989 | Farrow | |
| 6,236,283 | B1 | * | 5/2001 | Koslov | 332/103 |
| 6,600,495 | B1 | | 7/2003 | Boland et al. | |
| 6,710,725 | B1 | * | 3/2004 | Soques | 341/61 |
| 6,753,712 | B2 | * | 6/2004 | Saeki | 327/165 |
| 7,239,116 | B2 | * | 7/2007 | Tang | 323/282 |
| 2003/0025619 | A1 | | 2/2003 | Zhong | |

OTHER PUBLICATIONS

"Continuous-Time Digital Filters for Sample-Rate Conversion in Reconfigurable Radio Terminals", TIM Hentschel and Gerhard Fettweis, Proceedings of the European Wireless, VDE Verlag Berlin Offenbach, Dresden, Germany, Sep. 2000, pp. 55-59.
"Polyphase Implementation of Unrestricted Fractional Sample Rate Conversion", Alexandra Groth and Heinz G. Göckler, Digital Signal Processing Group. Ruhr-Universität Bochum, 2000, 4 pgs,.

* cited by examiner

*Primary Examiner*—Lam T Mai
(74) *Attorney, Agent, or Firm*—Eschweiler & Associates, LLC

(57) ABSTRACT

Embodiments of an apparatus for sample rate conversion are described. Various embodiments include an interpolator configured to interpolate a digital input data stream by using values of an interpolation phase shift control quantity to generate a digital output data stream, a computing stage configured to compute values of the interpolation phase shift control quantity, and an enabling/disabling stage configured to selectively disable the interpolator while keeping the computing stage enabled.

26 Claims, 9 Drawing Sheets

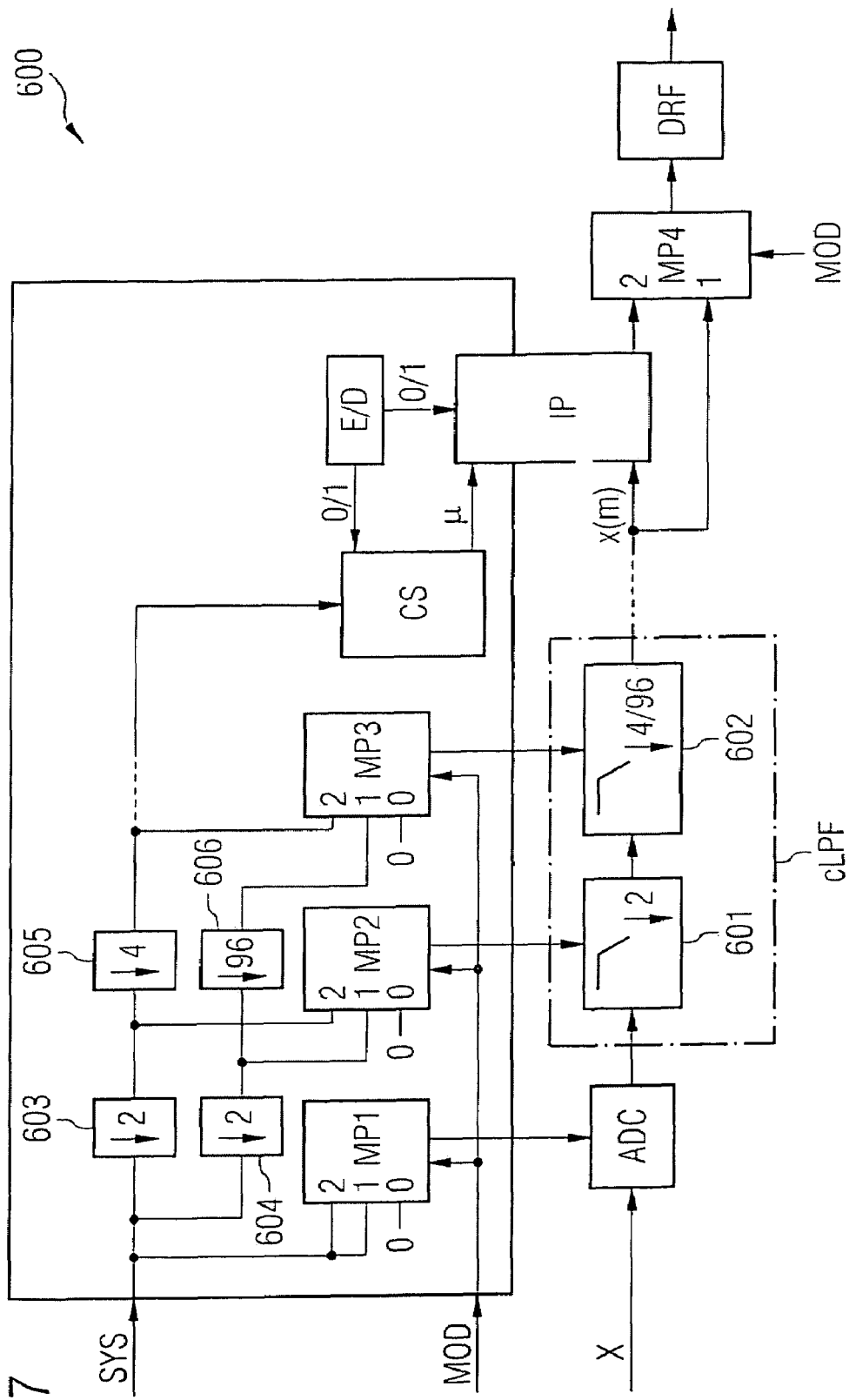

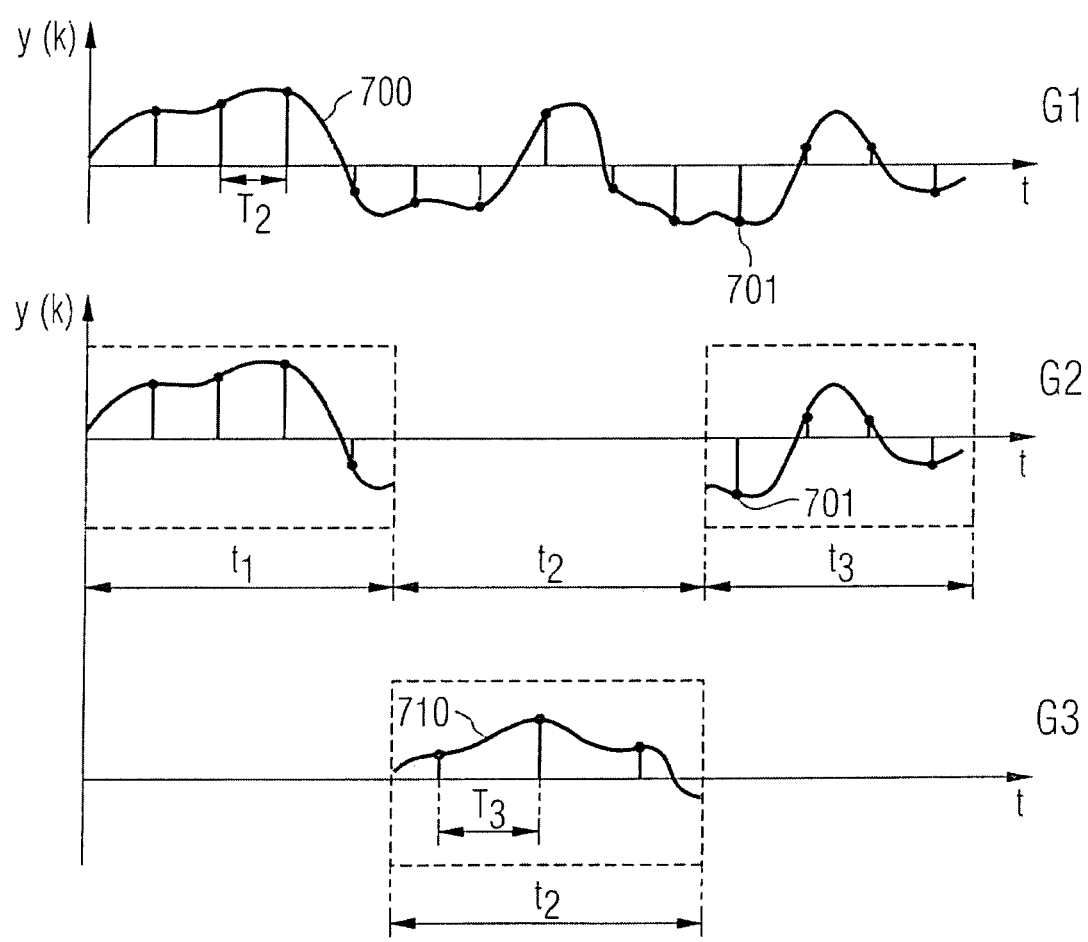

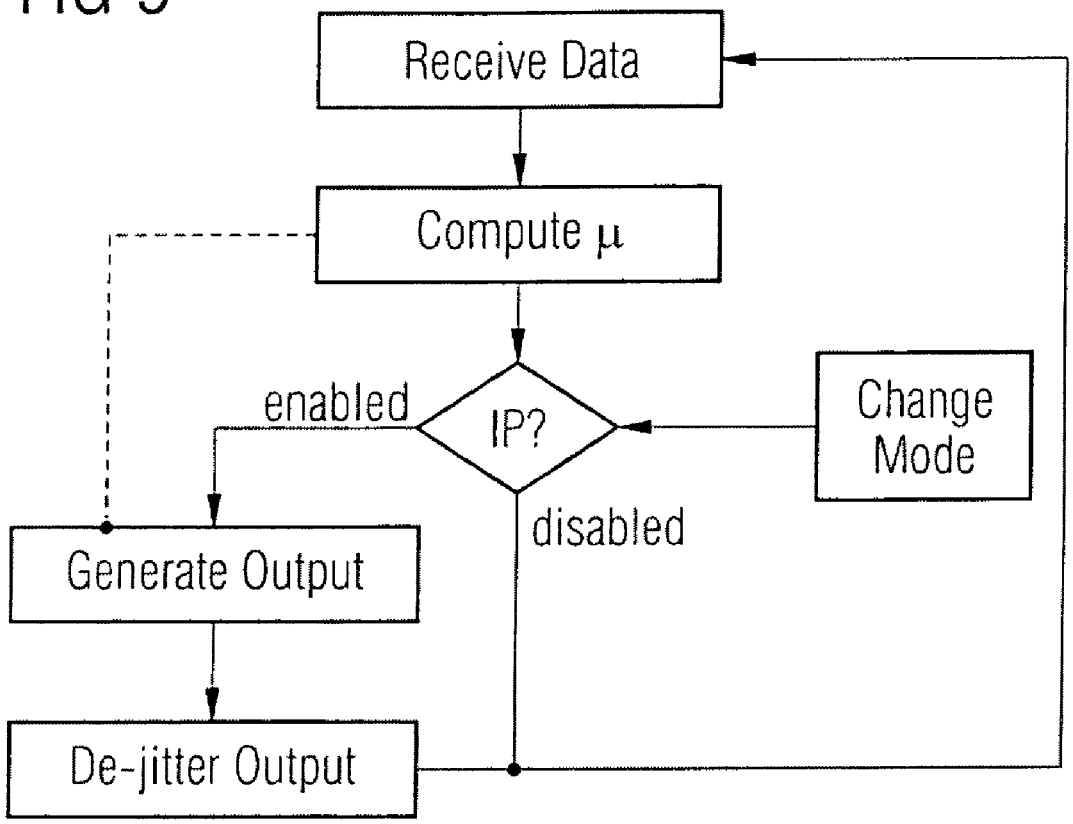

DIGITAL SAMPLE RATE CONVERSION

FIELD OF THE INVENTION

The invention relates to digital data processing and more particularly to digital sample rate conversion.

BACKGROUND OF THE INVENTION

Digital sample rate converters are used in various systems for data stream processing, in particular in communications systems.

BRIEF DESCRIPTION OF THE SEVERAL VIEWS OF THE DRAWINGS

Aspects of the invention are made more evident by way of example in the following detailed description of embodiments when read in conjunction with the attached figures, wherein:

FIG. 7 shows an exemplary embodiment of a data processing unit depicted in FIG. 6;

FIG. 8 shows graphs of a digital data stream having two different sampling rates; and FIG. 9 shows a flow diagram illustrating data processing in different operating modes.

DETAILED DESCRIPTION OF THE INVENTION

Figure 1:
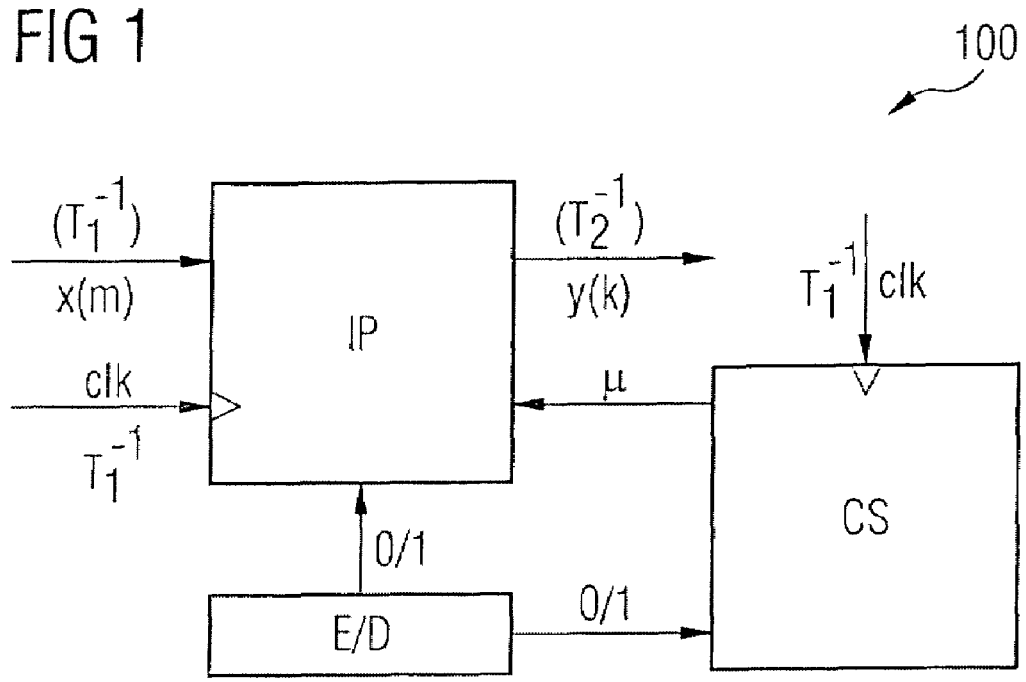
FIG. 1 shows a schematic diagram of an apparatus for sample rate conversion.

In the following, embodiments of the invention are described with reference to the drawings, wherein like reference numerals are generally utilized to refer to like elements throughout. In the following description, for purposes of explanation, numerous specific details are set forth in order to provide a thorough understanding of one or more aspects of embodiments of the invention. It may be evident, however, to one skilled in the art that embodiments of the invention may be practiced with a lesser degree of these specific details. The following description is therefore not to be taken in a limiting sense.

The term "sample rate conversion" in one embodiment refers to changing the sample rate (often also denoted as sampling rate) of a digital data stream from a first sampling rate to a second sampling rate.

The term "interpolator" in one embodiment refers to a device configured to generate second data samples from first data samples by means of interpolation using the values of a phase shift control quantity computed on the basis of the ratio of the first and the second data sample rates. The interpolator may be implemented as an interpolation filter, for example, a Farrow filter or a polyphase filter.

FIG. 1 shows an apparatus 100 for sample rate conversion. The apparatus 100 comprises an interpolator IP configured to interpolate a digital input data stream x(m) having a first sample rate $T_1^{-1}$ by using values of an interpolation phase shift control quantity μ to generate a digital output data stream y(k) having a second sample rate $T_2^{-1}$, where m and k are indices denoting the discrete time spacing in units of $T_1$ and $T_2$, respectively. Further, the apparatus 100 comprises a computing stage CS configured to compute values of the interpolation phase shift control quantity μ and an enabling/disabling stage E/D configured to selectively disable the interpolator IP while keeping the computing stage CS enabled. The apparatus 100 for sample rate conversion may be a down conversion or up conversion sample rate converter, i.e. $T_1 < T_2$ or $T_1 > T_2$. Further it may be a fractional sample rate converter if $T_1$ and $T_2$ are not integer multiples of each other.

The interpolator IP may be any kind of interpolator suited to convert the sample rate $T_1^{-1}$ of the digital input stream x(m) to a different sample rate $T_2^{-1}$, thus generating a digital output stream y(k) having the different sample rate $T_2^{-1}$. The computing stage CS provides values of the interpolation phase shift control quantity μ and feeds these values to the interpolator IP. The interpolation phase shift control quantity μ may take on values dependent on the ratio of the first and the second sample rates. It is to be noted that in one embodiment the digital output data stream y(k) may be output at time instants that are spaced unequal in time in such a way that the time average over the unequally spaced intervals between output time instants of data samples of the digital output data stream y(k) corresponds to the inverse $T_2$ of the second sample rate $T_2^{-1}$.

The enabling/disabling stage E/D may be able to control the interpolator IP in such a way that the interpolator IP is not generating a digital output data stream y(k) for a time span controlled by the enabling/disabling stage E/D. In a disabled state of the interpolator IP, the input data stream x(m) may be blocked or may pass the interpolator IP without being altered by the interpolator IP. To this end, in one embodiment the interpolator IP may be powered down, i.e. cut off from the supply voltage, or the clock signal supplied to the interpolator IP may be gated. During that time span when the interpolator IP is disabled, the enabling/disabling stage E/D in one embodiment may control the computing stage CS in such a way that the computing stage CS is continuing to generate updated values of the interpolation phase shift control value μ. After the time span controlled by the enabling/disabling stage E/D the interpolator IP may be enabled again, continuing to generate a digital output data stream y(k) using the updated, actual values of the interpolation phase shift control quantity μ provided by the computing stage CS. Thus, although the interpolator IP did not operate during the time span when it was disabled, it will instantaneously recover its correct time basis (i.e. the sample timings of the output data stream y(k)), as these interpolated sample timings are continuously calculated and updated in the computing stage CS.

As is illustrated in FIG. 1, in one embodiment the interpolator IP and the computing stage CS may be clocked at the first sample rate $T_1^{-1}$. Although a clock rate corresponding to the first sample rate $T_1^{-1}$ is used throughout the description for the interpolator IP and the computing stage CS, it is also possible to use other clock rates different from the first sample rate $T_1^{-1}$.

Figure 2:
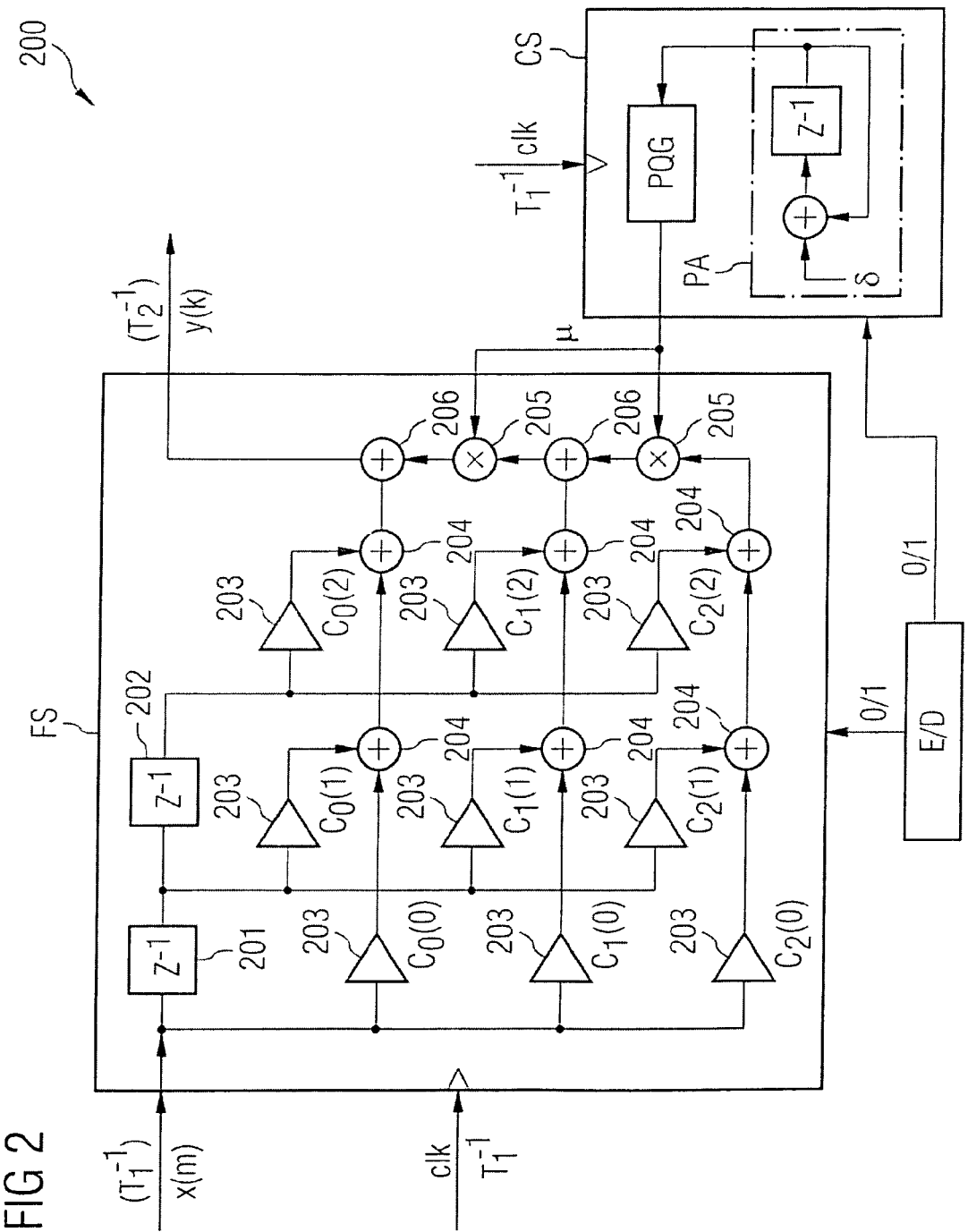
FIG. 2 shows a schematic diagram of an exemplary embodiment of an apparatus for sample rate conversion.

According to a first exemplary embodiment, the apparatus 100 for digital sample rate conversion may be designed according to the apparatus 200 for digital sample rate conversion as shown in FIG. 2. In FIG. 2 the interpolator IP of FIG. 1 is implemented as a Farrow filter FS configured to interpolate the digital input data stream x(m) having a first sample rate $T_1^{-1}$ by using values of an interpolation phase shift control quantity μ to generate a digital output data stream y(k) having the (nominal) second sample rate $T_2^{-1}$. The Farrow filter FS shown in FIG. 2 is shown to be of third order in this example, but a Farrow filter of any order may be used.

More specifically, the Farrow filter shown in FIG. 2 comprises two delay stages 201, 202, a number of first multipliers 203, a number of first adders 204, two second multipliers 205 and two second adders 206. The first multipliers 203 are arranged to weight taps of the delay line represented by the delay stages 201, 202 by coefficients $c_i(j)$ used as interpolation coefficients. These interpolation coefficients $c_i(j)$ in a Farrow filter are made to be a function of the coefficients of a third degree polynomial and the delay between the two sampling rates. The weighted sample taps are added by first adders 204. The second multipliers 205 and second adders 206 are connected to constitute a combiner used to combine the summation results dependent on the actual value of the interpolation phase shift control quantity $\mu$ to yield the output data stream y(k). Thus, the combiner 205, 206 uses the interpolation phase shift control quantity $\mu$ as a weighting parameter. In one embodiment the values $c_i(j)$ may be programmable according to the ratio of the first and the second sample rate. The maximum value of index i depends on the order of the Farrow filter and the maximum value of index j depends on the delay length of the Farrow filter. As already mentioned, the Farrow filter FS in one embodiment may be clocked at the first sample rate $T_1^{-1}$.

In one embodiment the computing stage CS may include a phase accumulator PA and an interpolation phase shift control quantity generator PQG having an input coupled to the output of the phase accumulator PA. The computing stage CS may e.g. be clocked at the same sample rate $T_1^{-1}$ as the Farrow filter FS. In one embodiment the computing stage CS may be clocked in phase with the Farrow filter FS.

The interpolation phase shift control quantity generator PQG may be a modulo stage or an overflow stage in one embodiment. The phase accumulator PA may be fed with a quantity $\delta$, which may be externally controllable. According to one embodiment, the quantity $\delta$ may be an integer representative of the second sample rate. In particular, if the quantity $\delta$ is an integer representative of the second sample rate, the interpolation phase shift control quantity generator PQG may be designed as a modulo stage. In that case, the interpolation phase shift control quantity generator PQG may divide the output of the phase accumulator PA by an integer quantity representative of the first sample rate, subsequently calculate the modulo of the result of the division, and provide the result of the modulo calculation as the interpolation phase shift control quantity $\mu$. For instance, if the ratio is $T_2^{-1}/T_1^{-1}=n_2/n_1$, with $n_1$, $n_2$ are integers, the quantity $\delta$ may be set to $n_2$ and the modulo-operation may comprise a division by $n_1$. Thus, $\mu_m = m \times n_2 \bmod n_1$.

According to another embodiment, the quantity $\delta$ may be a fractional value representative of the ratio of the second and the first sample rate. If the quantity $\delta$ is set to be a fractional value representative of the ratio of the second and the first sample rate, i.e. $\delta = n_2/n_1$, the interpolation phase shift control quantity generator PQG may be designed as an overflow stage. In that case, the interpolation phase shift control quantity generator PQG may cut off the integer part of the output of the phase accumulator PA and may provide the result of the cut off operation as the interpolation phase shift control quantity $\mu_m$. As apparent from the above, in one embodiment interpolation phase shift control quantity $\mu_m$ is calculated at each sample time m of the first sample rate $T_1^{-1}$.

Figure 3:
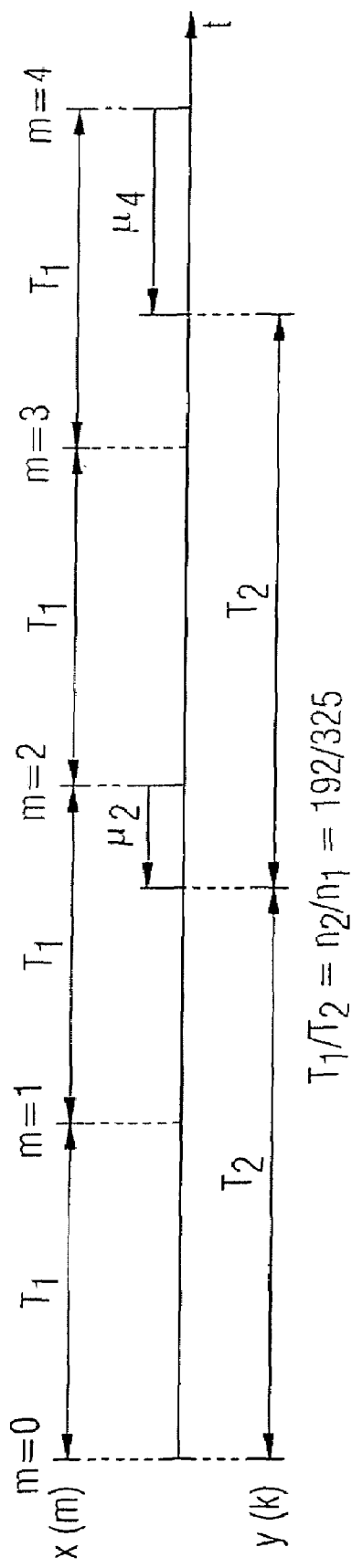
FIG. 3 shows a diagram illustrating a phase shift control quantity for controlling sample rate conversion.

FIG. 3 depicts a time chart showing the sample timings of the input data stream x(m) and the sample timings for which data values of the output data stream y(k) are computed. In the example, a sample rate down conversion from $T_1^{-1}=13$ MHz to $T_2^{-1}=7.68$ MHz is assumed by way of example. Then, $T_1/T_2=n_2/n_1=192/325$. The computing stage CS calculates $\mu_m = m \times 192 \bmod 325$. A value for $\mu_m$, i.e. the remainder of division of $m \times n_2$ by $n_1$, will only be output if the integer being the largest integer smaller than the quotient $(m \times n_2)/n_1$ increases when advancing from m−1 to m. As known in the art, this integer is given by the floor function floor $(m \times n_2/n_1)$. Let $nf_m = \text{floor}(m \times n_2/n_1)$. Then, regarding FIG. 3, at m=0, $m_0=0$ and $nf_0=0$, at m=1, $nf_1$ is still 0 and therefore, $\mu_1$ is not output. At m=2, $\mu_2=59$ and is output since $nf_2=1$, i.e. has increased by 1. At m=3, $\mu_3$ is not output since $nf_3$ is still 1. At m=4, $nf_4=2$ and thus $\mu_4=118$ is output by the computing stage CS.

As depicted in FIG. 3, the quantities $\mu_2$ and $\mu_4$ represent a phase shift relative to the first sample rate timings $m \times T_1$ of the input data stream x(m). Using these phase shifts $\mu_m$, the interpolation timings (i.e. the times at which interpolated data samples y(k) are to be calculated for k=1, 2, . . . ) are defined according to the time chart illustrated in FIG. 3. As the interpolator IP outputs interpolated data within the time pattern defined by the first sample rate $m \times T_1$ at an average data output rate of $T_2^{-1}$, the instantaneous data output rate of the interpolator IP may jitter.

Figure 4:
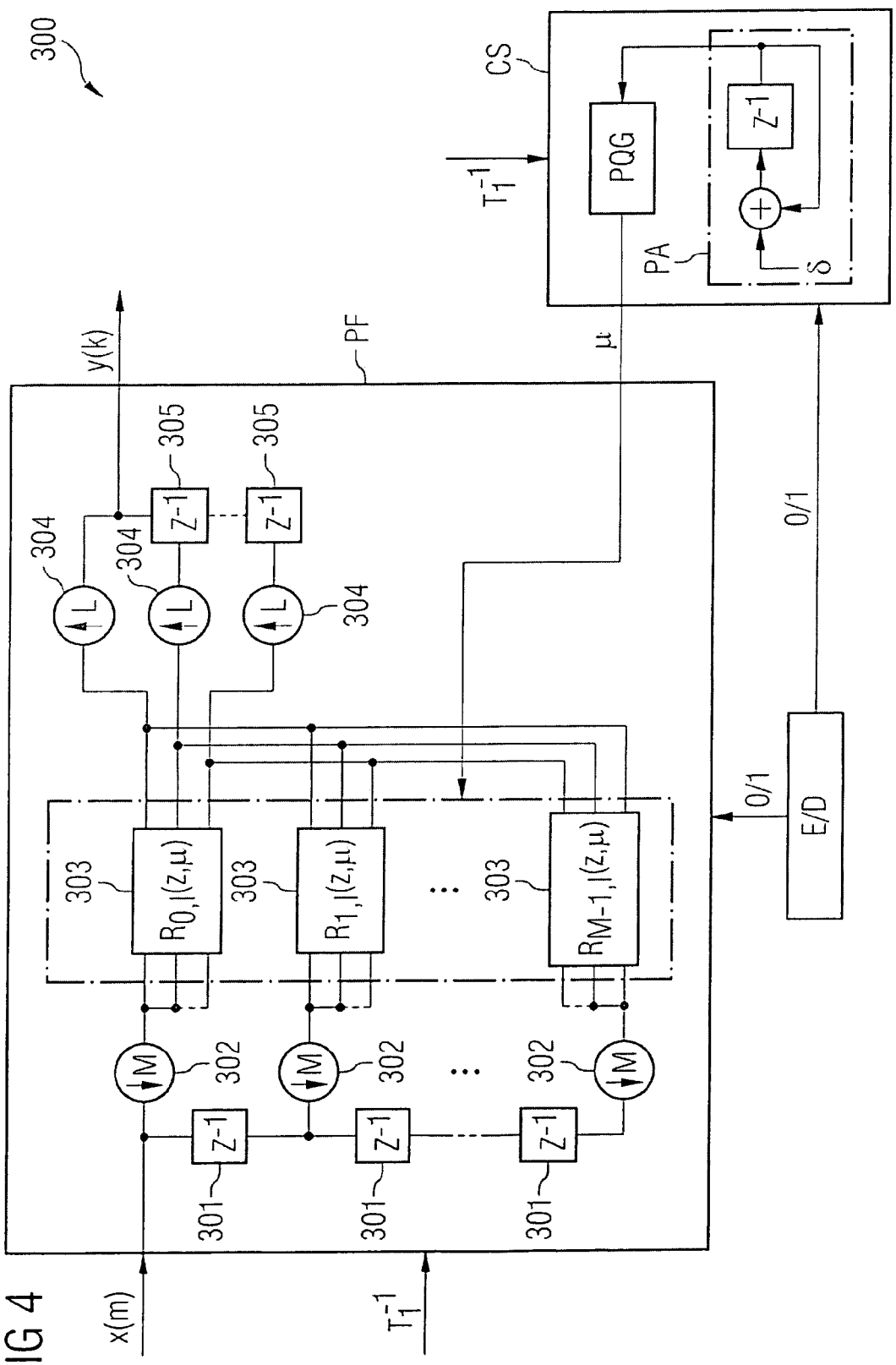
FIG. 4 shows a schematic diagram of another exemplary embodiment of an apparatus for sample rate conversion.

FIG. 4 shows a further exemplary embodiment of an apparatus 300 for sample rate conversion. The description of the apparatus 100 of FIG. 1 applies also to apparatus 300. In FIG. 4 the interpolator IP of FIG. 1 is implemented as a polyphase filter PF configured to interpolate the digital input data stream x(m) having a first sample rate $T_1^{-1}$ by using values of an interpolation phase shift control quantity $\mu$ to generate a digital output data stream y(k) having a second sample rate. The polyphase filter PF shown in FIG. 4 is exemplary shown to be a block processing polyphase filter PF, but a polyphase filter of any kind may be used. By way of example, the polyphase filter PF comprises delay stages 301 serially arranged to form a delay line, down-sampling stages 302 connected to taps of the delay line to performing a M times decimation operation and branch filter processing blocks 303 having transfer functions $R_m, l(z,\mu)$ which may be used as interpolation coefficients. The functions $R_m, 1(z,\mu)$ may be defined in such a way, that in one embodiment the sum of the respectively delayed branch filter outputs over L equals the value of a branch filter function $H_m(z)$ specific to a corresponding one of the M delayed and down-sampled polyphase inputs. Consequently, the sum of the respectively delayed branch filter functions over the M delay lines resembles the interpolated and sample rate converted output of the polyphase filter. In this case, the indices m and l denote running summation indices representative of the number of the M corresponding down-sampling stages 302 and L corresponding up-sampling stages 304. The functions $R_m, l(z,\mu)$ may be programmable according to the ratio of the first and the second sample rate. The output of each processing blocks 303 may e.g. be L times up-sampled in up-sampling stages 304 and fed into an output delay line formed by delay stages 305.

The computing stage CS as well as the enabling/disabling stage E/D may be configured as described above in conjunction with FIGS. 1 to 3. Again, the polyphase filter PF may be clocked at the first sample rate $T_1^{-1}$ and the computing stage CS may be clocked at the same first sample rate. In particular, the computing stage CS may be clocked in phase with the polyphase filter PF.

Figure 5:
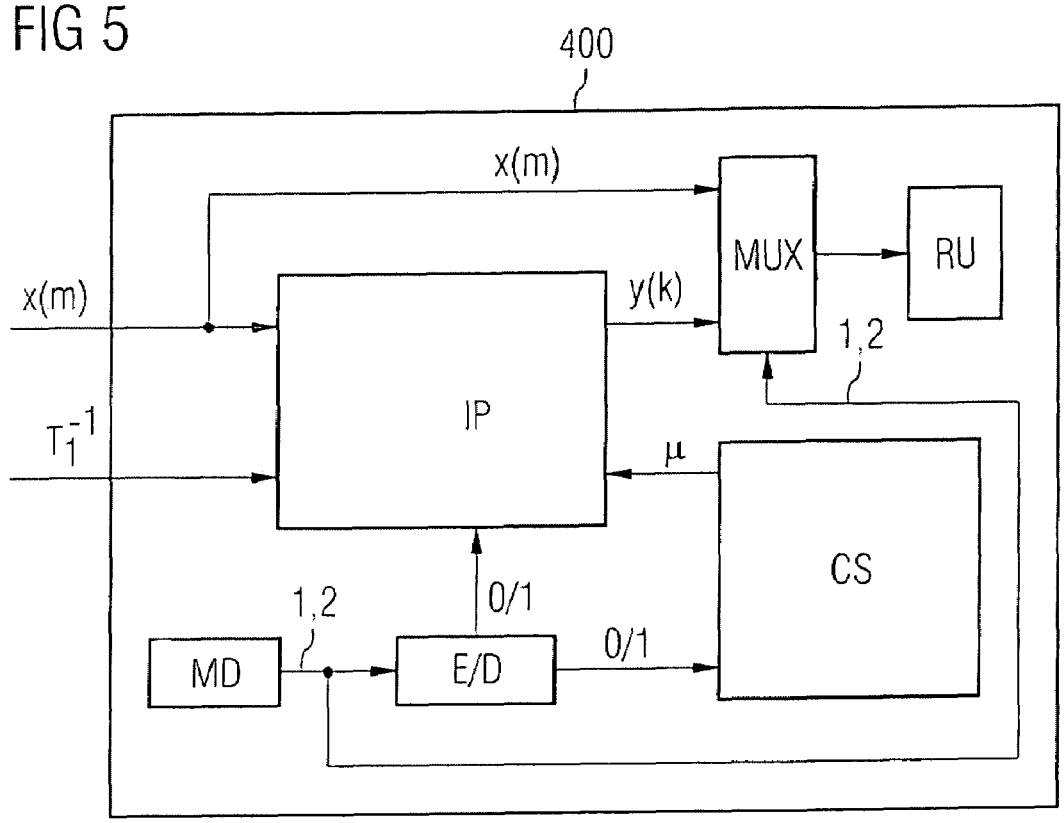
FIG. 5 shows a schematic diagram of a transmitter and/or receiver comprising an apparatus for sample rate conversion.

FIG. 5 shows a schematic diagram of a transmitter and/or receiver 400. The transmitter and/or receiver 400 is containing an apparatus according to FIG. 1. The transmitter and/or receiver 400 further contains a receiving and/or transmitting unit RU and a mode determining unit MD configured to determine whether the receiver and/or transmitter 400 and especially the receiving and/or transmitting unit RU is operating in a first receive and/or transmit mode associated with a first data rate $T_1^{-1}$ of the received and/or transmitted data stream x(m) or in a second receive and/or transmit mode associated with a second data rate $T_2^{-1}$ of the received and/or transmitted data stream y(k). The second data rate $T_2^{-1}$ of the received and/or transmitted data stream y(k) may be generated by the interpolator IP as described above.

The transmitter and/or receiver 400 may comprise a multiplexer MUX having two inputs fed by the received and/or transmitted data streams x(m) and y(k). Multiplexer MUX is controlled by the mode determining unit MD. If the receiving and/or transmitting unit RU is to be operating in the first receive and/or transmit mode associated with the first data rate $T_1^{-1}$, the multiplexer MUX is controlled by the mode determining unit MD to pass the receive and/or transmit input data stream x(m) to the output of the multiplexer MUX. Otherwise, if the receiving and/or transmitting unit RU is to be operated in the second receive and/or transmit mode associated with the second data rate $T_2^{-1}$, the interpolated receive and/or transmitted data stream y(k) is passed to the output of the multiplexer MUX. The output of the multiplexer MUX is coupled to the receiving and/or transmitting unit RU, which performs in one embodiment appropriate receive and/or transmit signal processing such as demodulation, equalizing, de-interleaving, decoding and/or encoding, interleaving, modulation etc.

Further, the enabling/disabling stage E/D is controlled by the mode determining unit MD. If the multiplexer MUX is controlled to pass the received and/or transmitted input data stream x(m) to its output, the enabling/disabling stage E/D disables the interpolator IP and maintains the computing stage CS enabled. Otherwise, if the multiplexer MUX is controlled by the mode determining unit MD to pass the received and/or transmitted interpolated data stream y(k) to its output, the enabling/disabling stage E/D enables the interpolator IP and maintains the computing stage CS enabled.

The first receive and/or transmit mode may be a first mobile communications standard mode and the second receive and/or transmit mode may be a second mobile communications standard mode, different from the first mobile communications standard mode. In particular, the first mobile communications standard mode may be a second generation (2G) mode such as a GSM (Global System for Mobile Communications) mode and the second mobile communications standard mode may be a third generation (3G) mode such as an UMTS (Universal Mobile Telecommunications Systems) mode. While the receiver and/or transmitter 400 is operated in the first mobile communications standard mode, i.e. is processing the received and/or transmitted data stream x(m) bypassing the interpolator IP, the computing stage CS updates values of the interpolation phase shift control quantity μ according to the sample rate associated with the first receive and/or transmit mode. Then, if the second receive and/or transmit mode is switched back to the second receive and/or transmit mode, the interpolator IP is enabled and outputs the received and/or transmitted interpolated data stream y(k). In other words, the computing stage CS "conserves" the time basis for the second receive and/or transmit mode during operation of the first receive and/or transmit mode, when the interpolator IP is disabled.

The receiver and or transmitter 400 may also contain a mode determining unit MD configured to determine whether the receiver and or transmitter 400 is operating in a first receive and/or transmit mode associated with an idle state of the receiver and/or transmitter 400, especially of the receiving and/or transmitting unit RU, or in a second receive mode associated with an active state of the receiver and/or transmitter 400, especially the receiving and/or transmitting unit RU. In an idle state of the receiver and/or transmitter 400, it may not be necessary that the received and/or transmitted data stream x(m) is bypassed to the multiplexer MUX for further processing. Therefore, regarding the receiver and/or transmitter 400 shown in FIG. 5, the multiplexer MUX may not be needed. The enabling/disabling stage E/D may be controlled by the mode determining unit MD in such a way, that the interpolator IP may be disabled when the receiver and/or transmitter 400 is in the idle state. While being in the idle state, the computing stage CS may continue to update values of the interpolation phase shift control quantity μ in order to "conserve" the correct time basis for outputting the interpolated received and/or transmitted data stream y(k) once the receiver and/or transmitter 400 is switched back to the active state.

Figure 6:
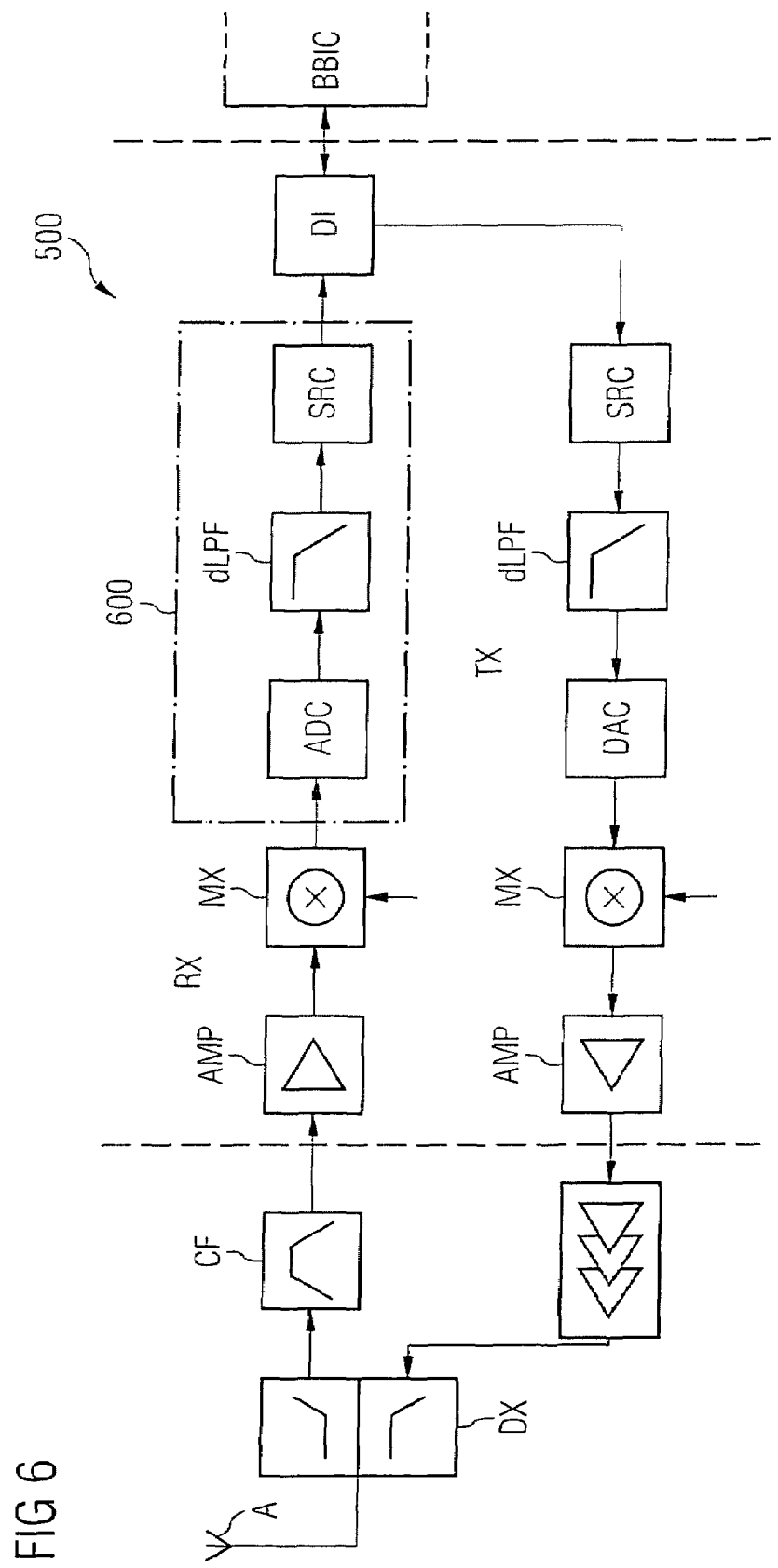
FIG. 6 shows an exemplary embodiment of a transmitting and a receiving data path.

FIG. 6 shows an exemplary embodiment of a receiver and transmitter 500. Data streams may be collected and/or emitted by an antenna A. A duplexer DX may be configured to separate data streams received from data streams transmitted on different frequency bands, and may be coupled to at least one receiving path RX and at least one transmitting path TX. The duplex DX allows to simultaneously transmit and receive data streams on separate frequency bands, as it is necessary in various communication systems and in particular in various mobile communications standard modes such as in particular in an UMTS mode.

The receiving path RX of the transmitting and receiving unit 500 may contain various functional elements such as a channel filter CF, an amplifier AMP, a mixing stage MX and/or a digital low-pass filter dLPF. These elements may be arranged in variable order along the receiving path RX. The receiving path RX may further contain an analog-to-digital converter ADC. The receiving path RX may also contain an apparatus for fractional sample rate conversion SRC, configured according to the embodiments presented in FIGS. 1 to 5.

The transmitting path TX of the transmitting and receiving unit 500 may contain functional elements such as an amplifier AMP, a mixing stage MX and a digital low-pass filter dLPF. These elements may be arranged in variable order along the transmitting path TX. The transmitting path TX may further contain a digital-to-analog converter DAC. The transmitting path TX may also contain an apparatus for fractional sample rate conversion SRC, configured according to the embodiments presented in FIGS. 1 to 5. The receiving path RX and the transmitting path TX are coupled to a digital interface DI configured to couple the transmitting path TX and the receiving path RX to a baseband integrated circuit BBIC.

FIG. 7 shows an exemplary embodiment of a receiving section 600 of the receiving path RX as shown in FIG. 6. An analog signal x is received by the analog-to-digital converter ADC. Throughout all embodiments, the analog-to-digital converter ADC may be e.g. a sigma-delta converter. The analog-to-digital converter ADC may be driven at a sample rate determined by the system clock signal SYS. The system clock signal rate may take on any value, in particular it may be 104 MHz. A multiplexer MP1 is controlled by a receiving mode determining signal MOD which may take on the values 0 for an idle state, 1 for a first receiving mode and 2 for a second receiving mode. The multiplexer MP1 passes the system clock signal SYS to the analog-to-digital converter ADC in the cases when the receiving mode determining signal MOD is 1 or 2 and gates the system clock signal SYS from the analog-to-digital converter ADC when the receiving mode determining signal MOD is 0. The analog-to-digital converter ADC may also be driven at different system clock signal rates depending on the receiving mode.

The analog-to-digital converter ADC outputs a digital data stream to the digital low-pass filter dLPF (cf. FIG. 6), which is in FIG. 7 shown to be implemented e.g. as a cascading digital low-pass filter cLPF. The cascading digital low-pass filter cLPF may contain any number of different low-pass filters. In an exemplary embodiment shown in FIG. 7 the cascading digital low-pass filter cLPF includes two low-pass filters 601, 602 in a serial configuration. Two multiplexers MP2 and MP3 are configured to pass frequency divided system clock signals downsampled by dividers 603, 604 and 605, 606 to the two low-pass filters 601 and 602, respectively. The multiplexers MP2 and MP3 may be controlled by the receiving mode determining signal MOD. The system clock signal SYS may be downsampled by arbitrary, typically integer ratios before being coupled by the multiplexers MP2 and MP3 to the low-pass filters 601, 602. In particular, in an exemplary embodiment, the digital data stream output by the analog-to-digital converter ADC may be downsampled in the cascading digital low-pass filter cLPF by a factor of 8 for the first receiving mode and by a factor of 192 for the second receiving mode. For example, if the rate of the system clock signal SYS is set to 104 MHz, the first low-pass filter 601 is driven at a clock rate of 52 MHz in the first receiving mode and in the second receiving mode, and the second low-pass filter 602 is driven at 13 MHz in the first receiving mode and at 542 kHz in the second receiving mode. In the idle mode the cascading digital low-pass filter cLPF may not be provided with any clock signal.

The filtered data stream which corresponds to the digital input data stream x(m) is coupled into an interpolator IP according to one of the FIGS. 1 to 5. A multiplexer MP4 (which corresponds to multiplexer MUX in FIG. 5) may be configured to either pass the digital data stream x(m) through the interpolator IP to a digital RF processing unit DRF or to pass the digital data stream x(m) unaltered to the digital RF processing unit DRF. The interpolator IP may be controlled by a computing stage CS according to one of the FIGS. 1 to 5. The computing stage CS may be driven at a clock rate corresponding to the downsampled system clock signal SYS used as the sample rate for the second receiving mode. For example, if the system clock rate is 104 MHz, the computing stage CS may be driven at 13 MHz. The interpolator IP may be driven at the same clock rate as the computing stage CS.

In one embodiment both the interpolator IP and the computing stage CS are controlled by an enabling/disabling stage E/D according to one of the FIGS. 1 to 5. As already explained in conjunction with FIGS. 1 to 6, the computing stage CS may continuously update values of an interpolation phase shift control quantity μ, which are fed to the interpolator IP. In particular, the interpolation phase shift control quantity μ may be calculated while the interpolator IP is disabled by the enabling/disabling stage E/D. For example, if the multiplexer MP4 is set to the second receiving mode, where the data stream is sample rate converted by the interpolator IP, the interpolator IP is enabled and fed by the interpolation phase shift control quantity μ provided by the computing stage CS. In another example, if the multiplexer MP4 is set to the first receiving mode, where the digital data stream x(m) is passed to the digital RF processing unit DRF without being interpolated by the interpolator IP, the interpolator IP is disabled, but the interpolation phase shift control quantity μ is still updated by the computing stage CS.

It is to be noted that the above numerical example relates to a receiver section 600 which operates as a GSM receiver in the first receiving mode (MOD=1) and operates as an UMTS receiver in the second receiving mode (MOD=2). Thus, in the UMTS mode, the sample rate of the digital input data stream x(m) at the input of the interpolator IP is 13 MHz and the sample rate at the output of the interpolator is 7.68 MHz corresponding to twice the chip rate in UMTS (which is 3.84 MHz). Consequently, any data sample at the output of the interpolator IP corresponds to a "half-chip". On the other hand, when the receiving section 600 is operated in the GSM mode (MOD=1), the interpolator IP is disabled and the digital input data stream x(m) fed via multiplexer MP4 to the digital RF processing unit DRF has a sample rate of 542 kHz being twice the symbol rate in GSM, which is 271 kHz. Thus, in GSM, "half-symbols" are supplied by the receiving section 600.

The digital RF processing unit DRF may be operable to de-jitter the digital data signal output by the interpolator IP. As it is apparent from FIG. 3, the interpolated data stream y(k) has a jitter in time, because the data samples y(k) are output at multiples of first sample time duration $T_1$. To this end, the digital RF processing unit DRF may comprises a FIFO (First-In-First-Out) memory, which buffers data samples of the incoming data stream y(k) and outputs these data samples at time instants regularly spaced in time by intervals of length $T_2 T_2^{-1}$.

Further, integer downsampling as accomplished by the dividers 603, 604, 605 and 606 arranged upstream of multiplexers MP2 and MP3 and fractional sample rate conversion as provided by the interpolator IP may be configured to show a partition different from that illustrated in FIG. 7. It is also possible to omit integer downsampling, resulting in that the digital data stream x(m) at the input of the interpolator IP has the same sample rate for both receiving modes (or, in view of FIG. 5, for both transmitting and/or receiving modes). A fractional sample rate converter in accordance with the foregoing description may be used in any receiver and/or transmitter having e.g. one single system clock and being configured to be operated in at least two different receive and/or transmit modes in which none of the at least two data rates involved in these modes is an integer multiple of the other data rate. Further, sample rate conversion may depend on these predetermined data rates (e.g. chip rates, symbol rates) of the receive and/or transmit modes involved.

It is to be noted that in one embodiment a transmitting section comprised of e.g. the units SRC, dLPF and DAC in the transmitting path TX of the receiver and/or transmitter unit 500 shown in FIG. 6 may be configured analogously to the receiving section 600 as detailed in FIG. 7. To avoid reiteration, such transmitting section is not illustrated in detail herein.

Throughout all embodiments, the apparatus for sample rate conversion may be designed as a multi-rate fractional sample rate converter configured to provide for a plurality of different fractional sample rate conversion ratios. To this end, in one embodiment the interpolator IP may be coupled to a plurality of computing stages CS each operating on an individual sample rate conversion ratio. Switching from one sample rate to another sample rate at the output of the interpolator IP may be accomplished by means of a selector switch configured to connect the desired computing stage CS to the interpolator IP. In order to "conserve" the time basis for all sample rate conversion ratios, the computing stages CS will remain enabled even is deselected.

FIG. 8 shows three graphs G1, G2 and G3 in which exemplary data streams processed by the apparatus in one of the FIGS. 1 to 7 are shown. The graph G1 shows the digital output data stream y(k) of the interpolator IP in its analog representation. Dots along the graph G1 indicate digital sample values of the data stream 700, i.e. the sequence of digital sample values computed by the interpolator IP. The data stream 700 may correspond to the digital output data stream y(k) of the interpolator IP in the UMTS mode, cf. e.g. FIG. 7. Note that in graph G1, the digital sample values of the data stream 700 are depicted under equidistant time intervals spaced by $T_2$. Thus, the time scale shown in graph G1 may either be interpreted as a reference time scale according to which the digital sample values y(k) are calculated in the interpolator IP or may be interpreted as the real time scale after de-jittering the digital sample values y(k) for instance in the digital RF processing unit DRF (cf. FIG. 7).

Graph G2 shows the digital data samples y(k) when the interpolator IP is disabled during a time span $t_2$. In a first time span $t_1$ the digital sample values y(k) are identical to the digital sample values y(k) in the continuous mode as shown in graph G1. Then, during time span $t_2$, the disabled interpolator IP fails to produce an output y(k). At the beginning of a third time span $t_3$, the interpolator IP is enabled again. Then, the first value to be calculated by the interpolator IP corresponds to dot 701, which is identical to dot 701 in graph G1. As the data sample value y(k) at dot 701 is calculated on the basis of the actual interpolation phase shift control quantity μ (which is continuously updated during the time span $t_2$) and the equidistant time scale given by the first sample rate $T_1^{-1}$, which is delivered to the interpolator IP, the first interpolated data sample value at dot 701 and all other subsequent data sample values are correctly calculated by the interpolator IP.

During time span $t_2$, the receiver and/or transmitter comprising the interpolator IP may be e.g. in an idle state or may be operating in another communications standard mode. Graph G3 illustrates data samples of a data stream 710 associated with another communications standard mode, e.g. GSM, in the receiver and/or transmitter. More specifically, the data samples associated with the data stream 710 may correspond to data samples x(m) of the digital input data stream received in the GSM mode at the interpolator IP in FIGS. 5 and 7. When the second time span $t_2$ has elapsed, the sampling of the data stream 700 at the second sampling rate $T_2^{-1}$ is continued during the third time span $t_3$ according to graph G2.

FIG. 9 shows a flow diagram of a method for sample rate conversion. Although the method is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein as well as in association with other structures not illustrated.

A method 800 for sample rate conversion includes receiving a digital input data stream 802 having a first sample rate, computing values of an interpolation phase shift control quantity μ 804, generating a digital output data stream 806 having a second sample rate by interpolating (IP) the digital input data stream using the values of the interpolation phase shift control quantity μ, disabling the generation of the digital output data stream while continuing to compute updated values of the phase shift control quantity μ, and enabling the generation of the digital output data stream using the updated values of the interpolation phase shift control quantity μ. The computing of the interpolation phase shift control quantity μ may be accomplished by any kind of computing stage according to FIGS. 1 to 5. The enabling and/or disabling of the interpolator may be accomplished by an enabling/disabling stage according to one of the FIGS. 1 to 7. The enabling and/or disabling of the interpolator may be accomplished at any point of time during the execution of the method according to FIG. 9. In particular, it may be accomplished after a mode determining unit 807 has determined a change of receive and/or transmit modes and/or a change of active and idle states in a receiving and/or transmitting unit. The generation of the output data stream may be accomplished by an interpolator according to one of the FIGS. 1 to 7. In particular, it may be accomplished by a Farrow filter, in particular a Farrow filter or by a polyphase filter.

As already mentioned, the output data stream may optionally be de-jittered at 808, if desired. As described in more detail above, de-jittering of the output data stream may be accomplished by a FIFO included in a digital RF processing unit arranged downstream of the interpolator.

The method according to FIG. 9 may be used in a receiver and/or a transmitter. In particular, while being used in a receiver, it may further include feeding the generated digital output data stream having a second sample rate to a baseband processing unit of the receiver, while the generation of the digital output data stream is enabled, and feeding the digital input data stream having a first sample rate to the baseband processing unit of the receiver, while the generation of the digital output data stream is disabled. In particular, when being used in a transmitter, it may further include feeding the generated digital output data stream having a second sample rate to a RF processing unit of the transmitter, while the generation of the digital output data stream is enabled, and feeding the digital input data stream having a first sample rate to the RF processing unit of the transmitter while the generation of the digital output data stream is disabled.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An apparatus for sample rate conversion, comprising:
an interpolator configured to interpolate a digital input data stream having a first sample rate using values of an interpolation phase shift control quantity to generate a digital output data stream having a second sample rate;
a computing stage configured to compute values of the interpolation phase shift control quantity; and an enabling/disabling stage configured to selectively disable the interpolator while keeping the computing stage enabled.

2. The apparatus of claim 1, wherein the interpolator comprises a Farrow filter.

3. The apparatus of claim 2, wherein the Farrow filter comprises a third order filter.

4. The apparatus of claim 1, wherein the interpolator comprises a polyphase filter.

5. The apparatus of claim 1, wherein the computing stage comprises a phase accumulator.

6. The apparatus of claim 5, wherein the phase accumulator is clocked at the first sample rate.

7. The apparatus of claim 5, wherein the computing stage further comprises a modulo stage coupled to an output of the phase accumulator.

8. The apparatus of claim 5, wherein the computing stage further comprises an overflow stage coupled to an output of the phase accumulator.

9. The apparatus of claim 1, wherein the computing stage comprises an input for variably setting a quantity representative of the first or second sample rate, or both.

10. A receiver, comprising:
an apparatus for sample rate conversion, comprising:
an interpolator configured to interpolate a digital input data stream having a first sample rate using values of an interpolation phase shift control quantity to generate a digital output data stream having a second sample rate;
a computing stage configured to compute values of the interpolation phase shift control quantity; and
an enabling/disabling stage configured to selectively disable the interpolator while keeping the computing stage enabled.

11. A receiver of claim 10, further comprising:
a mode determining unit configured to determine whether the receiver is operating in a first receive mode associated with a first data rate of the received data stream or in a second receive mode associated with a second data rate of the received data stream, wherein
the enabling/disabling stage is controlled by the mode determining unit.

12. The receiver of claim 11, wherein:
the receiver comprises a mobile phone receiver, and
the first mode is a receive mode for signals stipulated in a first mobile communications system standard and the second mode is a receive mode for signals stipulated in a second mobile communications system standard different from the first mobile communications system standard.

13. The receiver of claim 10, further comprising:
a mode determining unit configured to dictate whether the receiver is operating in a first receive mode associated with an active state of the receiver or in a second receive mode associated with an idle state of the receiver, wherein
the enabling/disabling stage is controlled by the mode determining unit.

14. The receiver of claim 10, further comprising:
a baseband processing unit having an input, and
a selector configured to feed the input of the baseband processing unit either with the digital output data stream having a second sample rate or the digital input data stream having a first sample rate.

15. A transmitter, comprising:
an apparatus for sample rate conversion, comprising:
an interpolator configured to interpolate a digital input data stream having a first sample rate using values of an interpolation phase shift control quantity to generate a digital output data stream having a second sample rate;
a computing stage configured to compute values of the interpolation phase shift control quantity, and
an enabling/disabling stage configured to selectively disable the interpolator while keeping the computing stage enabled.

16. The transmitter of claim 15, further comprising:
a mode determining unit configured to dictate whether the transmitter is operating in a first transmit mode associated with a first data rate of the transmitted data stream or in a second transmit mode associated with a second data rate, wherein
the enabling/disabling stage is controlled by the mode determining unit.

17. The transmitter of claim 16, wherein:
the transmitter is a mobile phone transmitter, and
the first mode is a transmit mode for signals stipulated in a first mobile communications system standard and the second mode is a transmit mode for signals stipulated in a second mobile communications system standard different from the first mobile communications system standard.

18. The transmitter of claim 15, further comprising:
a mode determining unit configured to dictate whether the receiver is operating in a first transmit mode associated with an active state of the transmitter or in a second transmit mode associated with an idle state of the transmitter, wherein
the enabling/disabling stage is controlled by the mode determining unit.

19. The transmitter of claim 15, further comprising:
an RF processing unit having an input; and
a selector configured to feed the input of the RF processing unit either with the digital output data stream having a second sample rate or the digital input data stream having a first sample rate.

20. A method for sample rate conversion, comprising:
receiving a digital input data stream having a first sample rate;
computing values of an interpolation phase shift control quantity;
generating a digital output data stream having a second sample rate by interpolating the digital input data stream using the values of the interpolation phase shift control quantity;
disabling the generation of the digital output data stream while continuing to compute updated values of the phase shift control quantity; and
enabling the disabled generation of the digital output data stream using the updated values of the interpolation phase shift control quantity.

21. The method of claim 20, further comprising de-jittering the digital output data stream.

22. The method of claim 20, wherein interpolating the digital input data stream comprises filtering the digital input data stream using a Farrow filter.

23. The method of claim 20, wherein interpolating the digital input data stream comprises filtering the digital input data stream using a polyphase filter.

24. A method for processing an input data stream in a receiver or transmitter, comprising:
receiving a digital input data stream having a first sample rate;

computing values of an interpolation phase shift control quantity;

generating a digital output data stream having a second sample rate by interpolating the digital input data stream using the values of the interpolation phase shift control quantity;

disabling the generation of the digital output data stream while continuing to compute values of phase shift control quantity; and thereafter enabling the generation of the digital output data stream using the updated values of the interpolation phase shift control quantity.

25. The method of claim 24, further comprising;

while the generation of the digital output data stream is enabled, feeding the generated digital output data stream having a second sample rate to a baseband processing unit of the receiver; and while the generation of the digital output data stream is disabled, feeding the digital input data stream having a first sample rate to the baseband processing unit of the receiver.

26. The method of claim 24, further comprising;

while the generation of the digital output data stream is enabled, feeding the generated digital output data stream having a second sample rate to a RF processing unit of the transmitter; and while the generation of the digital output data stream is disabled, feeding the digital input data stream having a first sample rate to the RF processing unit of the transmitter.

* * * * *